(12) United States Patent
Matsumoto et al.

(10) Patent No.: US 9,355,990 B2
(45) Date of Patent: May 31, 2016

(54) MANUFACTURING METHOD OF DEVICE EMBEDDED SUBSTRATE AND DEVICE EMBEDDED SUBSTRATE MANUFACTURED BY THIS METHOD

(75) Inventors: Tohru Matsumoto, Ayase (JP); Masaru Ogasawara, Ayase (JP); Mitsuaki Toda, Ayase (JP)

(73) Assignee: MEIKO ELECTRONICS CO., LTD., Ayase-shi, Kanagawa (JP)

( * ) Notice: Subject to any disclaimer, the term of this patent is extended or adjusted under 35 U.S.C. 154(b) by 0 days.

(21) Appl. No.: 14/423,990

(22) PCT Filed: Sep. 11, 2012

(86) PCT No.: PCT/JP2012/073205
§ 371 (c)(1),
(2), (4) Date: Feb. 25, 2015

(87) PCT Pub. No.: WO2014/041602
PCT Pub. Date: Mar. 20, 2014

(65) Prior Publication Data
US 2015/0243628 A1    Aug. 27, 2015

(51) Int. Cl.
*H01L 21/44* (2006.01)
*H01L 23/00* (2006.01)
(Continued)

(52) U.S. Cl.
CPC .......... *H01L 24/83* (2013.01); *H01L 21/76802* (2013.01); *H01L 21/76877* (2013.01);
(Continued)

(58) Field of Classification Search
CPC ............... H01L 2224/838; H01L 2224/0401; H01L 33/0079; H01L 24/94; H01L 2924/00014; H01L 2224/039
USPC ................... 257/724, 783, E23.16, E21.514, 257/E21.584; 438/614, 628, 644, 652, 654
See application file for complete search history.

(56) References Cited

U.S. PATENT DOCUMENTS

| | | | |
|---|---|---|---|
| 8,779,569 B2* | 7/2014 | Kimura et al. | 257/676 |
| 2010/0212946 A1* | 8/2010 | Shimizu et al. | 174/260 |
| 2014/0124256 A1* | 5/2014 | Hattori | H01G 2/065 |
| | | | 174/260 |

FOREIGN PATENT DOCUMENTS

| | | | |
|---|---|---|---|
| JP | 2008-522397 A | 6/2008 | |
| JP | 2010-027917 A | 2/2010 | |

(Continued)

OTHER PUBLICATIONS

Search Report for PCT/JP2012/073205, mailed Dec. 11, 2012.
(Continued)

*Primary Examiner* — Jasmine Clark
(74) *Attorney, Agent, or Firm* — Marshall, Gerstein & Borun LLP

(57) ABSTRACT

The present invention provides a manufacturing method of a device embedded substrate, including: forming a bonding layer of an insulation material on a metal layer formed on a support plate; and mounting an electric or electronic device on the bonding layer, wherein the device is formed of a device main body and a protruding terminal; the bonding layer includes a first bonding body bonded with the metal layer and a second bonding body bonded with the device; the first bonding body is formed along the outer edge of the device; the second bonding body is formed in an area equal or smaller than the area defined by the outer edge of the terminal; and, in the bonding layer forming step, the second bonding body is formed on the first bonding body after the first bonding body is cured.

5 Claims, 4 Drawing Sheets

(51) Int. Cl.
  *H05K 1/18* (2006.01)
  *H01L 21/768* (2006.01)
  *H01L 23/522* (2006.01)
  *H05K 3/30* (2006.01)
  *H01L 23/498* (2006.01)
  *H01L 23/50* (2006.01)
  *H01L 23/538* (2006.01)

(52) U.S. Cl.
  CPC ............ *H01L23/5226* (2013.01); *H05K 1/188* (2013.01); *H01L 23/49822* (2013.01); *H01L 23/49827* (2013.01); *H01L 23/50* (2013.01); *H01L 23/5389* (2013.01); *H01L 2924/12042* (2013.01); *H05K 3/305* (2013.01); *H05K 2201/10636* (2013.01); *H05K 2203/0152* (2013.01); *Y02P 70/611* (2015.11)

(56) References Cited

FOREIGN PATENT DOCUMENTS

JP  2010-157739 A  7/2010
WO  WO-2012/032654 A1  3/2012

OTHER PUBLICATIONS

Written Opinion for PCT/JP2012/073205, mailed Dec. 11, 2012.

\* cited by examiner

MANUFACTURING METHOD OF DEVICE EMBEDDED SUBSTRATE AND DEVICE EMBEDDED SUBSTRATE MANUFACTURED BY THIS METHOD

TECHNICAL FIELD

The present invention relates to a manufacturing method of a device embedded substrate and a device embedded substrate manufactured by this method.

BACKGROUND ART

There are various methods for manufacturing a device embedded substrate (e.g., see Patent Document 1). In such a method, a bonding layer is formed on a copper foil by means of a dispenser or by a printing method, a device to be embedded is mounted on the bonding layer, and the device is fixed by curing the bonding layer. Then, the device is embedded inside an insulation material by laminating press, and a via which reaches the terminal of the device from the outside is formed by laser processing. Then, this via is plated and turned into a conductive via to establish electrical connection with the terminal.

However, when the method as described above is used, a void (cavity) can be generated inside the bonding layer. This void may expand during a subsequent reflow step or cause separation or short-circuit. Especially when the surface on which the device comes into contact with the bonding layer is uneven, generation of a void becomes significant. There is concern that the generation of such a void may affect the formability and the connection reliability of the conductive via or the insulation performance. Especially in the case of a substrate with an embedded active device having a plurality of electrodes, voids cannot be usually removed by performing a void deaeration step. Since a wiring pattern is typically formed on the substrate surface at a position corresponding to a position between the electrodes, a void generated between these electrodes may cause short-circuit or migration between the electrode and the wiring pattern.

PRIOR ART DOCUMENT

Patent Document

Patent Document 1: Japanese Patent Application Laid-Open No. 2010-27917

SUMMARY OF THE INVENTION

Problems to be Solved by the Invention

The present invention has been made in consideration of the above-described prior art, and an object of the present invention is to provide a manufacturing method of a device embedded substrate and a device embedded substrate manufactured by this method which can secure the insulation performance even when a void is generated.

Means for Solving the Problems

In order to achieve the above object, the present invention provides a manufacturing method of a device embedded substrate, including: a bonding layer forming step of forming a bonding layer constituted of an insulation material on a metal layer formed on a support plate; and a device mounting step of mounting an electric or electronic device on the bonding layer, wherein the device is formed of a device main body and a terminal protruding from the device main body; the bonding layer is constituted of a first bonding body to be bonded with the metal layer and a second bonding body to be bonded with the terminal; the first bonding body is formed substantially along the outer edge of the device in planar view; the second bonding body is formed in an area equal to or smaller than the area defined by the outer edge of the terminal in planar view; and, in the bonding layer forming step, the second bonding body is formed on the first bonding body after the first bonding body is cured.

In the bonding layer forming step, the second bonding body is preferably applied to and formed in an area smaller than the area defined by the outer edge of the terminal in planar view.

The manufacturing method of a device embedded substrate of the present invention preferably further includes: a laminating step, to be performed after the device mounting step, of laminating an insulation material to be an insulation layer on the device and embedding the device inside the insulation material; a via forming step of removing the support plate and forming a via which penetrates the metal layer and the bonding layer and reaches the terminal; a plating step of depositing a plated layer on the surface of the via; and a pattern forming step of forming a conductive pattern including the metal layer.

The present invention further provides a device embedded substrate which is manufactured by the above-described manufacturing method of a device embedded substrate and has the first bonding body formed between the conductive pattern and the device.

A void is preferably generated inside the second bonding body.

Advantageous Effects of the Invention

According to the present invention, when the conductive pattern is formed on the substrate surface, as the first bonding body constituted of an insulation material is interposed between the conductive pattern and the second bonding body, a distance corresponding to the thickness of the first bonding body results between the conductive pattern and the second bonding body. Therefore, sufficient insulation characteristic and insulation deterioration characteristic are obtained between the conductive pattern and the second bonding body. That is, even when a void is generated in the second bonding body, since the insulation performance is secured by the first bonding body, it is possible to prevent short-circuit or migration occurring between the electrode and the wiring pattern. Since the first bonding body is formed substantially along the outer edge of the device in planar view, it is possible to securely suppress the influence of the void generated in the second bonding body. Moreover, since the first bonding body is previously cured in the bonding layer forming step, it is possible to prevent the substrate from being forwarded to the next step with a void generated in it, and to reliably obtain the effect of the insulation performance of the first bonding body.

In addition, if the second bonding body is applied to an area equal to or smaller than the area defined by the outer edge of the terminal in planar view, the device can be mounted with a smaller amount of second bonding body, so that a void is less likely to be generated and the problems of short-circuit and migration can be further reduced.

MODE FOR CARRYING OUT THE INVENTION

Figure 1:
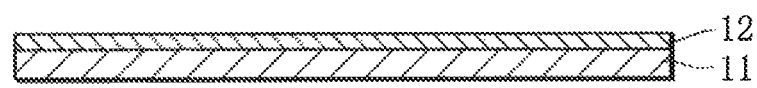
FIG. 1 is a schematic view illustrating in sequence a manufacturing method of a device embedded substrate according to the present invention.
Figure 2:
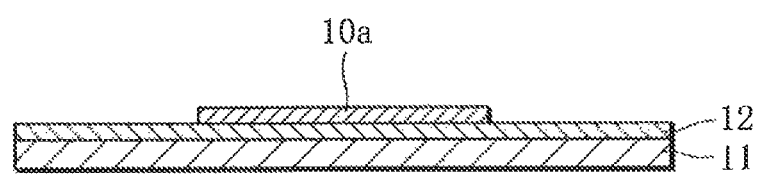
FIG. 2 is a schematic view illustrating in sequence the manufacturing method of a device embedded substrate according to the present invention.
Figure 3:
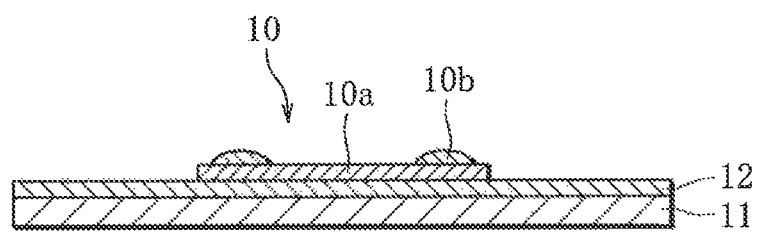
FIG. 3 is a schematic view illustrating in sequence the manufacturing method of a device embedded substrate according to the present invention.

In a manufacturing method of a device embedded substrate according to the present invention, first, a bonding layer forming step is performed as shown in FIG. 1 to FIG. 3. In this step, as shown in FIG. 1, for example, a metal layer 12 formed on a support plate 11 is prepared. The support plate 11 should have the rigidity as required by the process conditions. The support plate 11 is formed from a rigid SUS (stainless-steel) plate or aluminum plate, etc. as a support base material. When the support plate 11 is a SUS plate, for example, the metal layer 12 is obtained by attaching a copper foil of a predetermined thickness onto the support plate 11 or by depositing a copper-plated foil on the support plate 11. Alternatively, when the support plate 11 is an aluminum plate, the metal layer 12 is obtained by attaching a copper foil to the support plate 11.

As shown in FIG. 2, a first bonding body 10a is applied to the metal layer 12, for example, by means of a dispenser or by printing, etc. That is, the first bonding body 10a is bonded with the metal layer 12. Then, after the first bonding body 10a is cured, as shown in FIG. 3, a second bonding body 10b is applied onto the first bonding body 10a. The second bonding body 10b is also applied by means of a dispenser or by printing, etc. These first bonding body 10a and second bonding body 10b form a bonding layer 10. Thus, the step of forming the bonding layer 10 constituted of an insulation material on the metal layer 12 formed on the support plate 11 is a bonding layer forming step.

Figure 4:
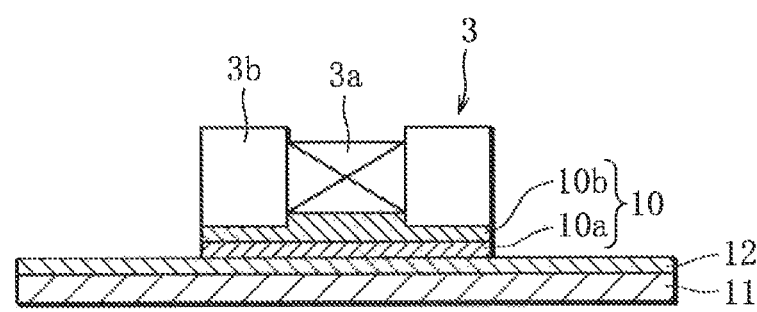
FIG. 4 is a schematic view illustrating in sequence the manufacturing method of a device embedded substrate according to the present invention.

Then, a device mounting step is performed as shown in FIG. 4. This device mounting step is a step of mounting an electronic or electric device 3 on the bonding layer 10. The device 3 to be mounted include active device and passive device. The device 3 has a device main body 3a and a terminal 3b protruding from the device main body 3a. In FIG. 4, a passive device is shown. The bonding body 10b is spread by mounting of the device 3, and is bonded not only with the terminal 3b but also with the device main body 3a. That is, in the device mounting step, the device 3 is mounted with the terminal 3b aligned with the position of the second bonding body 10b.

Then, a laminating step, a via forming step, a plating step, and a pattern forming step are performed. These steps will be described collectively with FIG. 5. The laminating step is performed to laminate the insulation material to be an insulation layer 2 on the device 3 and thereby to embed the device 3 inside the insulation material. In this step, an insulation material such as a prepreg is laid up on the side of the device 3 opposite to the side on which the metal layer 12 is disposed, and the laminate is pressed while being heated under vacuum. This pressing process is performed using a vacuum pressure-type press machine. The insulation material used is preferably similar in thermal expansion coefficient to the device 3.

Thereafter, the via forming step is performed. In this step, first, the support plate 11 is removed. This leaves the metal layer 12 exposed on one side surface of the insulation layer 2. On the other side surface of the insulation layer 2, another metal layer is formed. Then, a hole is bored using a laser etc. to form a via 13. Specifically, the via 13 is formed so as to extend from the metal layer 12 through the bonding layer 10 to reach the terminal 3b. Depending on the structure, a conductive through-hole or other conductive vias may be formed at this point in order to establish electric connection between the layers or between the front and rear sides. After the via is formed, a desmear treatment is performed to remove the resin remaining from formation of the via. Thereafter, a plating process (conduction process) is performed and a plated layer is deposited inside the via 13 to form a conductive via 7. This step of performing a plating process is the plating step.

Figure 5:
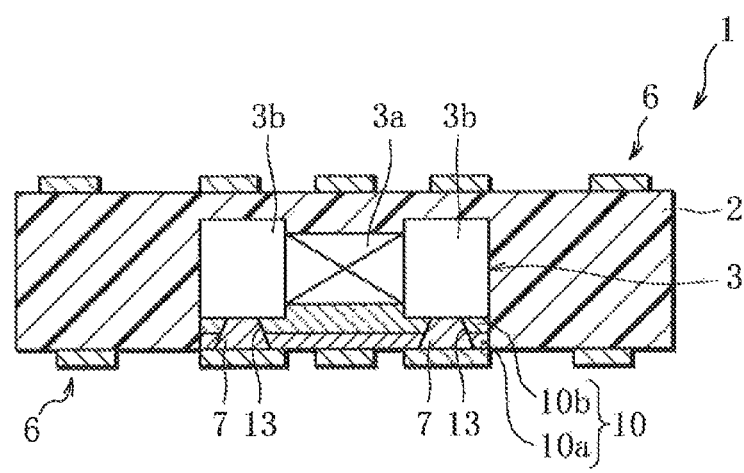
FIG. 5 is a schematic view of a device embedded substrate according to the present invention.
Figure 6:
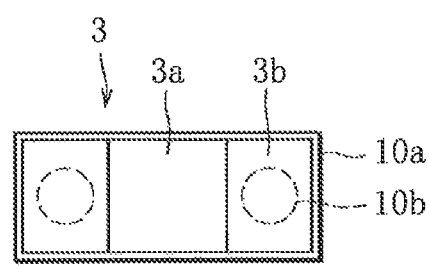
FIG. 6 is a schematic plan view with a passive device mounted.
Figure 7:
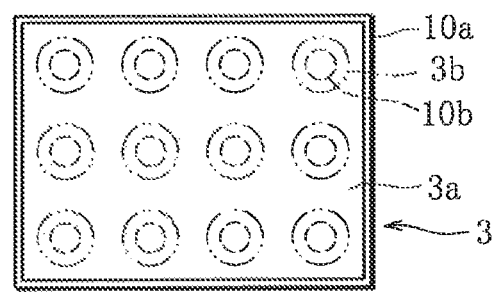
FIG. 7 is a schematic plan view with an active device mounted.

Then, the pattern forming step is performed. This step involves forming a conductive pattern 6 on both surfaces of the insulation layer 2 by etching etc. The device embedded substrate 1 obtained through these steps includes the insulation layer 2, the device 3, the conductive pattern 6, the bonding layer 10, and the conductive via 7 as shown in FIG. 5. The insulation layer 2 is a result of curing of the insulation material (prepreg etc.), and the device 3 is connected with the conductive pattern 6 through the bonding layer 10. The conductive pattern 6 is formed on the surface of the insulation layer 2.

Figure 8:
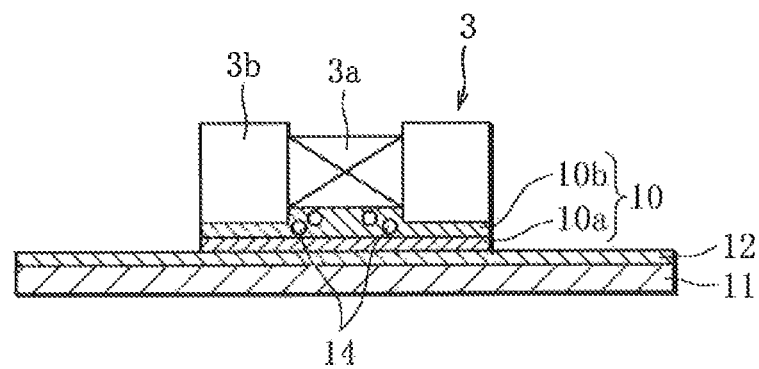
FIG. 8 is a schematic view showing a state where a void is generated in a device mounting step.

When the conductive pattern 6 is thus formed on the substrate surface, as the first bonding body 10a is interposed between the conductive pattern 6 and the second bonding body 10b, a distance corresponding to the thickness of the first bonding body 10a results between the conductive pattern 6 and the second bonding body 10b. Thus, sufficient insulation characteristic and insulation deterioration characteristic are obtained between the conductive pattern 6 and the second bonding body 10b. That is, even when voids 14 are generated in the second bonding body 10b as shown in FIG. 8 in the above-described device mounting step, since the insulation performance is secured by the first bonding body 10a, short-circuit or migration can be prevented from occurring between the terminal 3b (electrode) and the wiring pattern 6. In order to reliably secure the insulation characteristic by the first bonding body 10a, the thickness of the first bonding body 10a is preferably about 30 μm.

Since the first bonding body 10a is formed substantially along the outer edge of the device 3 in planar view, the influence of the voids 14 generated in the second bonding body 10b can be securely suppressed. That is, regardless of the position at which a void 14 is generated on the lower side of the device 3, the insulation performance between the conductive pattern 6 and the terminal 3b is maintained as the entire lower side of the device 3 is covered with the bonding body 10a.

Since the first bonding body 10a is previously cured in the bonding layer forming step, it is possible to prevent the substrate from being forwarded to the next step with a void generated in the first bonding body 10a, and to reliably obtain the effect of the insulation performance by the first bonding body 10a.

While the second bonding body 10b should be applied to an area within the outer edge of the terminal 3b in planar view, if the application area is smaller, the device can be mounted with a smaller amount of the second bonding body 10b, so that the void 14 is less likely to be generated and the problems of short-circuit and migration can be further reduced. The optimal application dimension of the second bonding body 10b for a φ200 μm terminal is φ150 μm, and that of the second bonding body 10b for a φ400 μm terminal is φ350 μm. In the case of an active device with a square terminal, if one side of the terminal is 200 μm long, the second bonding body 10b should also be square and one side thereof should be 150 μm long. The thickness of the second bonding body 10b should be 20 μm to 40 μm.

EXPLANATION OF REFERENCE SIGNS

1 device embedded substrate
2 insulation layer
3 electric or electronic device
3a device main body
3b terminal
6 conductive pattern
7 conductive via
10 bonding layer
10a first bonding body
10b second bonding body
11 support plate
12 metal layer
13 via
14 void

The invention claimed is:

1. A manufacturing method of a device embedded substrate, comprising:
   a bonding layer forming step of forming a bonding layer constituted of an insulation material on a metal layer formed on a support plate; and
   a device mounting step of mounting an electric or electronic device on the bonding layer, wherein
   the device is formed of a device main body and a terminal protruding from the device main body,
   the bonding layer is constituted of a first bonding body to be bonded with the metal layer and a second bonding body to be bonded with the device,
   the first bonding body extends substantially to the outer edge of the device in planar view,
   the second bonding body is applied to and formed in an area equal to or smaller than the area defined by the outer edge of the terminal in planar view, and
   in the bonding layer forming step, the second bonding body is formed on the first bonding body after the first bonding body is cured.

2. The manufacturing method of a device embedded substrate according to claim 1, wherein, in the bonding layer forming step, the second bonding body is applied to and formed in an area smaller than the area defined by the outer edge of the terminal in planar view.

3. The manufacturing method of a device embedded substrate according to claim 1, further comprising:
   a laminating step, to be performed after the device mounting step, of laminating an insulation material to be an insulation layer on the device and embedding the device inside the insulation material;
   a via forming step of removing the support plate and forming a via which penetrates the metal layer and the bonding layer and reaches the terminal;
   a plating step of depositing a plated layer on the surface of the via; and
   a pattern forming step of forming a conductive pattern including the metal layer.

4. A device embedded substrate manufactured by the manufacturing method of a device embedded substrate according to claim 3, wherein the first boning body is interposed between the conductive pattern and the device.

5. The device embedded substrate according to claim 4, wherein a void is generated inside the second bonding body.

* * * * *